United States Patent

Nakai et al.

[11] Patent Number: 5,219,700
[45] Date of Patent: Jun. 15, 1993

[54] PHOTOSENSITIVE COMPOSITION CONTAINING 1,2-NAPHTHOQUINONE-2-DIAZIDO-4-SULFONIC ACID ESTER, ALKALI-SOLUBLE RESIN, HALOMETHYLOXADIAZOLE COMPOUND AND A DYE

[75] Inventors: Hideyuki Nakai, Fussa; Kiyoshi Goto, Hachioji; Hiroshi Tomiyasu, Tama; Yoshiko Fujita, Nagoya, all of Japan

[73] Assignees: Mitsubishi Kasei Corporation; Konica Corporation, both of Tokyo, Japan

[21] Appl. No.: 858,441

[22] Filed: Mar. 24, 1992

Related U.S. Application Data

[63] Continuation of Ser. No. 416,453, Oct. 3, 1989, abandoned.

[30] Foreign Application Priority Data

Oct. 3, 1988 [JP] Japan .................. 63-249398
Oct. 4, 1988 [JP] Japan .................. 63-250248

[51] Int. Cl.$^5$ .......................... G03F 7/023; G03C 1/61
[52] U.S. Cl. .................................... 430/191; 430/165; 430/192; 430/193; 430/194; 430/196; 430/280; 430/343; 430/916; 430/920; 430/925
[58] Field of Search ............... 430/191, 192, 193, 280, 430/343, 916, 920, 925, 194, 196

[56] References Cited

U.S. PATENT DOCUMENTS

| | | | |
|---|---|---|---|
| 3,102,809 | 9/1963 | Endermann et al. | 430/193 |
| 4,606,995 | 8/1986 | Kita et al. | 430/191 |
| 4,738,915 | 4/1988 | Komine et al. | 430/191 |
| 4,840,869 | 6/1989 | Kita et al. | 430/191 |
| 4,845,008 | 7/1989 | Nishioka et al. | 430/191 |
| 4,943,511 | 7/1990 | Lazarus et al. | 430/192 |

FOREIGN PATENT DOCUMENTS

| | | | |
|---|---|---|---|
| 3097946 | 4/1988 | Japan | 430/192 |
| 3235936 | 9/1988 | Japan | 430/192 |

OTHER PUBLICATIONS

J. Kosar, "Light-Sensitive Systems," J. Wiley & Sons, 1965, pp. 339-352.

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

A photosensitive composition comprising (a) a 1,2-naphthoquinone-2-diazido-4-sulfonic acid ester compound, (b) alkali-soluble resin, (c) a halomethyloxadiazole compound which releases halogen free radicals by irradiation with actinic rays and (a) a dye which interacts with the decomposition product of said halomethyloxydiazole compound and discolors or develops color. The composition exhibits excellent development latitude, light safety, visible-on-exposure characteristic and printing resistance.

8 Claims, No Drawings

PHOTOSENSITIVE COMPOSITION CONTAINING 1,2-NAPHTHOQUINONE-2-DIAZIDO-4-SULFONIC ACID ESTER, ALKALI-SOLUBLE RESIN, HALOMETHYLOXADIAZOLE COMPOUND AND A DYE

This application is a continuation of application Ser. No. 07/516,453, filed on Oct. 3, 1989, now abandoned.

FIELD OF THE INVENTION

This invention relates to a photosensitive composition for photosensitive lithographic printing plates. More particularly, this invention relates to a photosensitive composition containing a naphthoquinone-diazide compound as a photosensitive component.

BACKGROUND OF THE INVENTION

The term "positive type photosensitive lithographic printing plate" generally means a printing plate comprising a hydrophilic support and an ink-receiving photosensitive layer which is formed on the surface of the support and is solubilized by actinic rays such as ultraviolet rays. When the photosensitive layer is imagewise exposed and developed, the non-image portion is removed leaving an image portion. Thus an image is formed. Lithography utilizes difference in the properties of the image portion which is lipophilic and the non-image portion which is hydrophilic.

The photosensitive layer of the positive-type photosensitive lithographic printing plate usually contains an o-quinonediazide compound as a photosensitive component and an alkali-soluble resin which enhances strength and alkali-solubility of the photosensitive layer. Among the o-quinonediazide compounds, 1,2-naphthoquinone-2-diazido-5-sulfonic acid ester compounds are generally preferred because of their high sensitivity and low cost.

Conventionally, developing of such positive photosensitive lithographic printing plates is usually effected with a developer comprising an aqueous alkali solution. The developing ability of a developer is influenced by various parameters and the developing ability falls because of the deterioration by processing a large number of printing plates, degeneration by air oxidation, etc. until the non-image portion cannot be completely dissolved in a rather short period of time. Therefore, photosensitive lithographic printing plates which have a high latitude in developability such that they can be as well developed with a deteriorated developer as developed with a fresh developer. Hereinafter, the limit at which underdeveloping begins is designated by the term "underdevelopability" with respect to photosensitive lithographic plate.

Meanwhile, in the so-called "multi-face exposure process", for instance, in which a photosensitive lithographic printing plate is successively exposed through a plurality of film originals which are placed on the printing plate one by one next to the previously exposed part, the exposed parts should be able to be distinguished from the unexposed parts for film originals to be properly positioned. For this purpose, photosensitive compositions for photosensitive lithographic printing plates usually contain a visiblizing agent pair in order to form visible images upon exposure. This property is hereinafter called "visible-on-exposure characteristic". Said visiblizing agent pair comprises a compound which produces an acid or free radicals upon exposure and a dye which changes color upon interaction with said acid or free radicals. Typical examples of such a compound that produces an acid or free radicals upon exposure are halomethylvinyloxazole compounds disclosed in Japanese Laid-Open Patent Publication No. 55-77742 (1980), for instance, etc. The "visible-on-exposure characteristic generally improves with the increase of the amount of such a compound added. On the other hand, however, deficiencies such as drop of sensitivity of photosensitive lithographic printing plates, fall of solubility with alkali, etc. are caused.

If the amount of the photosensitive component such as 1,2-naphthoquinone-2-diazido-5-sulfonic acid ester compound is increased in order to overcome the above-described deficiencies, the underdevelopability is improved but the sensitivity is lowered. Thus, satisfactory photosensitive compositions are not yet provided.

For better durability and chemical resistance of printing plates, a common novolak resin such as m-cresol novolak resin is used as a binder. In this case, however, printing resistance is not satisfactory when UV inks are used. Therefore, a heating treatment at an elevated temperature called "burning" is usually employed. However, burning tends to cause staining in the non-image portion of printing surface in the course of printing. This is caused by immigration of monomers contained in the resin of the image portion to the non-image portion in the course of burning.

The photosensitive layer using an o-quinonediazide compound, when handled under white fluorescent lamp, suffers from light fogging, and, when subsequently subjected to developing, the photosensitive layer at the image portion is corroded to cause reduction of film thickness, which makes poor the printing performance of the printing plate. Therefore, photosensitive lithographic printing plates having improved resistance to light fogging by white fluorescent lamp (hereinafter called "light tolerance") has been desired.

A photosensitive composition disclosed in Japanese Patent Application Publication No. 52-28401 (1977) comprises an o-naphthoquinonediazide sulfonic acid as a photosensitive material and an acrylic high polymer binder comprising a structural unit represented by the formula

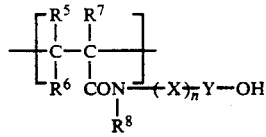

wherein $R^5$ and $R^6$ are a hydrogen atom or an alkyl group or a carboxylic acid group, respectively; $R^7$ is a hydrogen atom, a halogen atom or an alkyl group; $R^8$ is a hydrogen atom, an alkyl group, a phenyl group or an aralkyl group; X is a divalent organic group; n is an integer of 0 or 1; and Y is a substituted or unsubstituted phenylene or naphthylene group. This photosensitive composition contains the above-described high polymer binder instead of a novolak resin and thus is provided with good film strength and printing resistance.

However, it has been revealed that the positive type photosensitive lithographic printing plate comprising a photosensitive layer containing the above-described photosensitive composition disclosed in Japanese Patent Application Publication No. 52-28401 (1977) is still unsatisfactory in UV printing and the developing latitude thereof is low although it exhibits relatively good durability and chemical resistance in ordinary printing. The term "UV printing" means printing conducted using a printing ink containing a UV ray absorber (UV ink). It has been revealed that the reason why said printing plate is not suitable for UV printing is that the chemical resistance of the photosensitive layer to the ink and/or chemicals used in UV printing is poor.

As has been described above, there are known no photosensitive lithographic printing plates which are satisfactory in all of the visible-on-exposure characteristic, development latitude, light tolerance and durability.

Therefore, the purpose of the present invention is to provide a photosensitive composition provided with sufficient performance in all of the above-mentioned visible-on-exposure characteristic, development latitude, light tolerance and durability.

DISCLOSURE OF THE INVENTION

This invention provides a photosensitive composition comprising: (a) a 1,2-naphthoquinone-2-diazido-4-sulfonic acid ester compound; (b) an alkali-soluble resin; (c) a halomethyloxadiazole compound which releases halogen free radicals upon irradiation with actinic rays; and (d) a dye which interacts with the decomposition product of said halomethyloxadiazole compound and discolors or develops color.

In the present invention, although various known 1,2-naphthoquinone-2-diazido-4-sulfonic acid ester compounds (called "compound(s) of the present invention" hereinafter) can be used, especially esters of 1,2-naphthoquinone-2-diazido-4-sulfonic acid and a polycondensate resin of a phenol and an aldehyde or a ketone are preferred.

Examples of the above-mentioned phenol are: monohydric phenols such as phenol, o-cresol, m-cresol, p-cresol, 3,5-xylenol, carvacrol, thymol; dihydric phenols such as catechol, resorcin; trihydric phenols such as pyrogallol, phloroglucin, etc.; etc. Examples of the above-mentioned aldehyde are: formaldehyde, benzaldehyde, acetaldehyde, crotonaldehyde, furfural, etc. Among them, preferred are formaldehyde and benzaldehyde. Examples of the above-mentioned ketone are acetone, methylethylketone, etc.

Specific examples of the above-mentioned polycondensate resin are: phenol-formaldehyde resin, m-cresol-formaldehyde resin, p-cresol-formaldehyde resin, m-, p-mixed cresol-formaldehyde resin, resorcinbenzaldehyde resin, pyrogallol-acetone resin, etc.

The rate of polycondensation of the compound of the present invention, i.e., 1,2-naphthoquinone-2-diazido-4sulfonic acid per OH group of the phenol is preferably 15-80%, more preferably 20-60%.

Further, the compounds of the present invention include 1,2-naphthoquinone-2-diazido-4-sulfonic acid esters of polyhydroxy compounds. The examples thereof are: cyclohexyl 1,2-naphthoquinonediazido-4-sulfonate, 1-(1,2-naphthoquinonediazido-4-sulfonyl)-3,5dimethylpyrazole, 1,2-naphthoquinonediazido-4-sulfuric acid 4"-hydroxydiphenyl-4"-azo-β-naphthol ester, 2'-(1,2-naphthoquinonediazido-4-sulfonyloxy)-1-hydroxyanthraquinone, 1,2-naphthoquinonediazido-4-sulfonic acid 2,4-dihydroxybenzophenone ester, 1,2-naphthoquinonediazido-4-sulfonic acid 2,3,4-trihydroxybenzophenone ester, 1,2-naphthoquinonediazido-4-sulfonic acid 2,3,4',4'-tetrahydroxybenzophenone ester, a condensate of 2 moles of 1,2-naphthoquinonediazido-4-sulfonic acid chloride and 1 mole of 4,4'-dihydroxy-1,1'-diphenylsulfone, a condensate of 1 mole of 1,2-naphthoquinonediazido-4-sulfonic acid chloride and 1 mole of purpurogallin, etc.

Further, esters of 1,2-naphthoquinonediazido-4-sulfonic acid and a polyurethane resin as given below can be used.

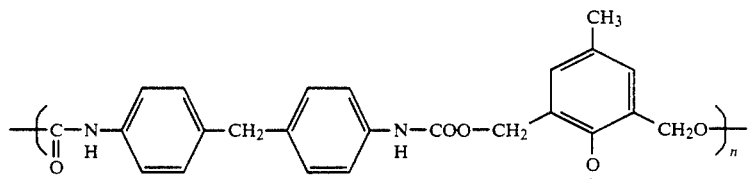

-continued

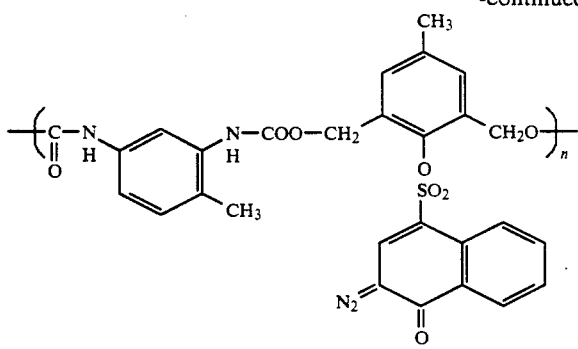

wherein n is an integer of 2-300.

Also, esters of a vinyl polymer having phenolic hydroxyl groups and 1,2-naphthoquinone-2-diazido-4-sulfonic acid can be used as a compound of the present invention. These vinyl polymers having phenolic hydroxyl groups contain structural units comprising phenolic hydroxyl groups in their molecule. Vinyl polymers those having structural units comprising phenolic hydroxyl groups, which are used as alkali-soluble resins as described hereinafter, are preferred.

The above-described compounds can be used alone or as a combination of two or more thereof. The content of the compounds of the present invention in the photosensitive composition of the present invention is preferably 5-60 wt. %, more preferably 10-50 wt. %.

The alkali-soluble resins used in the present invention are any of the known resins usable in this technical field. However, novolak resins and vinyl polymers containing structural units comprising phenolic hydroxyl groups in the molecule thereof are preferred.

Novolak resins preferably used in the present invention include resins obtained by condensing a phenol and an aldehyde in the presence of a catalyst. Examples of the phenol are: phenol, o-cresol, m-cresol, p-cresol, 3,5-xylenol, 2,4-xylenol, 2,5-xylenol, carvacrol, thymol, catechol, resorcinol, hydroquinone, pyrogallol, phloroglucin, etc. The above mentioned phenols may be used alone or as a combination of two or more thereof. Preferred novolak resins are copolymers of at least one of phenol, m-cresol (or o-cresol) and p-cresol and formaldehyde obtained by polycondensation thereof, such as phenol-formaldehyde resin, m-cresol-formaldehyde resin, o-cresol-formaldehyde resin, phenol-p-cresol-formaldehyde copolymer resin, m-cresol-p-cresol-formaldehyde copolymer resin, o-cresol-p-cresol-formaldehyde copolymer resin, phenol-o-cresol-p-cresol-formaldehyde copolymer resin. Of these novolak resins, phenol-m-cresol-p-cresolformaldehyde resin is preferred.

In the present invention, the above novolak resins may be used alone or as a combination of two or more thereof.

The molecular weight (with polystyrene as reference) of the novolak resins usable in the present invention should be within the range of $2.0 \times 10^3 - 2.0 \times 10^4$ as weight average molecular weight (Mw) and within the range of $7.0 \times 10^2 - 5.0 \times 10^3$ as number average molecular weight (Mn). Preferred molecular weight range is $3.0 \times 10^3 - 6.0 \times 10^3$ for Mw and $7.7 \times 10^2 - 1.2 \times 10^3$ for Mn. The measurement of the molecular weight of novolak resins is conducted by way of gel permeation chromatography (GPC).

The vinyl polymers having structural units comprising phenolic hydroxyl groups in the molecule thereof, which can be suitably used in the present invention, are preferably those which are formed by cleavage of the C—C double bond of vinyl monomers and contain at least one of the structural units represented by the following formulas [I] to [VI].

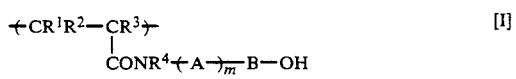

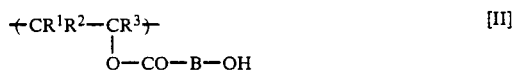

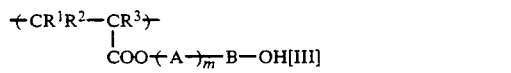

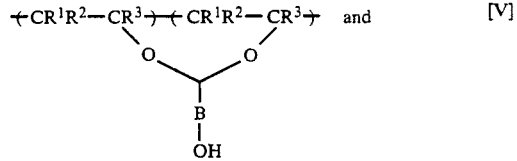

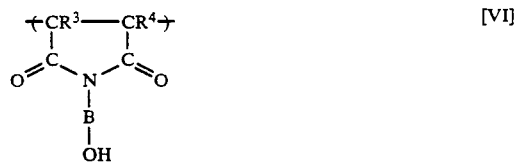

wherein $R^1$ and $R^2$ are respectively a hydrogen atom, a halogen atom, an aryl group, an alkyl group or a carboxyl group, preferably a hydrogen atom; $R^3$ is a hydrogen atom, a halogen atom, an alkyl group or an aryl group, preferably a hydrogen atom or an alkyl group such as methyl, ethyl, etc.; $R^4$ is a hydrogen atom, an alkyl group, an aryl group or an aralkyl group, preferably a hydrogen atom; A is an alkylene group which may contain a substituent or substituents; m is an integer of 0-10; and B is an aromatic group which may contain a substituent or substituents. In the present invention, the copolymers which contain at least structural units represented by the formula [I], are preferably used.

More preferably, copolymers which contain at least one structural unit represented by the formula [I], wherein $R^1$ and $R^2$ are respectively a hydrogen atom, a halogen atom, an alkyl group, an aryl group or a carboxylic group; $R^3$ is a hydrogen atom, a halogen atom, an alkyl group or an aryl group; $R^4$ is a hydrogen atom, alkyl group, an aryl group or an aralkyl group; B is an aromatic group which may contain a substituent or substituents; A is divalent organic group which connects said nitrogen atom and a carbon atom of said aromatic group; and m is an integer of 0-5.

The above-described vinyl polymers should preferably be of copolymeric structure, wherein a monomeric unit is copolymerized with at least one of the structural units represented by formulas [I]-[VI]. Examples of such monomeric unit is ethylenically unsaturated olefins such as ethylene, propylene, isobutylene, butadiene, isoprene, etc.; styrenes such as styrene, α-methylstyrene, p-methylstyrene, p-chlorostyrene, etc., acrylic acids such as acrylic acid, methacrylic acid, etc.; unsaturated dicarboxylic acids such as itaconic acid, maleic acid, maleic anhydride, etc.; α-methylene aliphatic monocarboxylic acid esters such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate, ethyl ethacrylate, etc.; nitriles such as acrylonitrile, methacrylonitrile, etc.; amides such as acrylamide, etc.; anilides such as acrylanilide, p-chloroacrylanilide, m-nitroacrylanilide, m-methoxyacrylanilide, etc.; vinyl esters such as vinyl acetate, vinyl propionate, vinylbenzoic acid, vinylbutyric acid, etc.; vinyl ethers such as methylvinylether, ethylvinylether, isobutylvinylether, β-chloroethylvinylether, etc.; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene, 1-methyl-1-nitroethylene, etc.; and N-vinyl compounds such as N-vinylpyrrole, N-vinylcarbazole, N-vinylindole, N-vinylpirrolidene, N-vinylpirrolidone, etc.

Of the above-described monomers, (meth)acrylic acids, esters of aliphatic monocarboxylic acids and nitriles exhibit comprehensively excellent performance and thus are preferred to be employed in combination with at least one of the structural units represented by the formulas [I]-[IV]. More preferred are methacrylic acid, methyl methacrylate, acrylonitrile, ethyl acrylate, etc.

These monomers may be copolymerized as blocks or randomly copolymerized in the above-described vinyl polymers.

The content of the structural unit represented by the formulas [I]-[VI]in said vinyl polymers is preferably 5-70 mole %, more preferably 10-40 mole %.

Said vinyl polymers can be used alone or as a combination of two or more thereof in the photosensitive composition.

Specific examples of the vinyl polymers used in the present invention are given below. In the following list of compounds, Mw stands for weight average molecular weight, Mn stands for number average molecular weight; s, k, l, o, m and n stand for mole percentage of each structural unit in the compound.

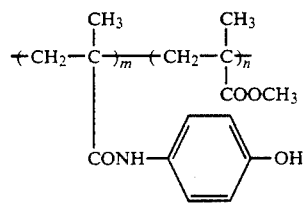
(a)

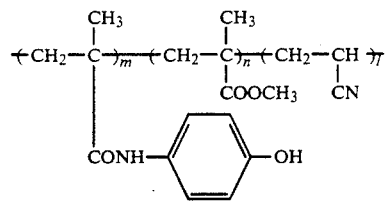
(b)

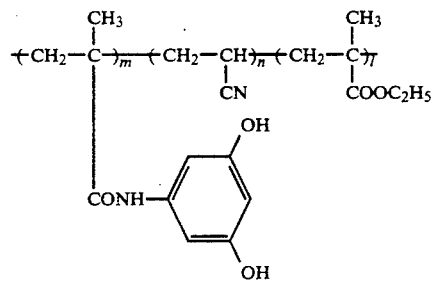
(c)

-continued
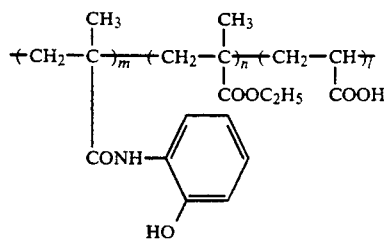
$$\begin{pmatrix} Mw = 33000, Mw/Mn = 7 \\ m:n:l = 38:60:2 \end{pmatrix}$$
(d)
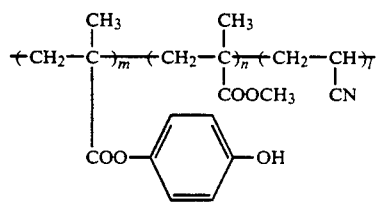
$$\begin{pmatrix} Mw = 40000, Mw/Mn = 3.5 \\ m:n:l = 20:60:20 \end{pmatrix}$$
(e)
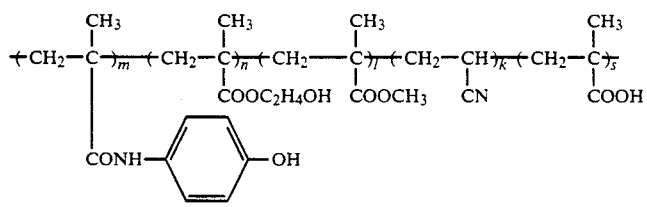
$$\begin{pmatrix} Mw = 35000, Mw/Mn = 7.9 \\ m:n:l:k:s = 20:15:30:33:2 \end{pmatrix}$$
(f)
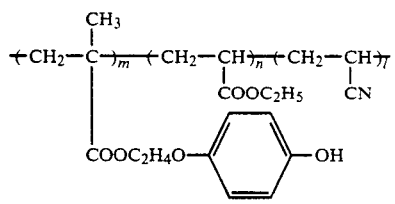
$$\begin{pmatrix} Mw = 35000, Mw/Mn = 3.5 \\ m:n:l = 30:30:40 \end{pmatrix}$$
(g)
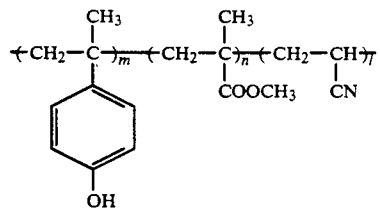
$$\begin{pmatrix} Mw = 54000, Mw/Mn = 8.2 \\ m:n:l = 20:40:40 \end{pmatrix}$$
(h)
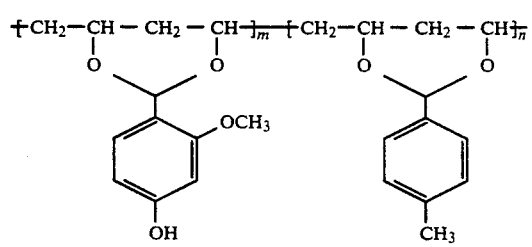
(i)

$\begin{pmatrix} Mw = 20000, Mw/Mn = 3.5 \\ m:n = 20:1:1 \end{pmatrix}$ (j)

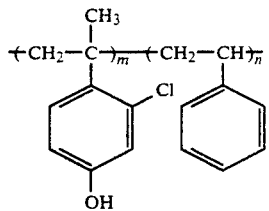

$\begin{pmatrix} Mw = 51000, Mw/Mn = 5.7 \\ m:n = 1:1 \end{pmatrix}$ (k)

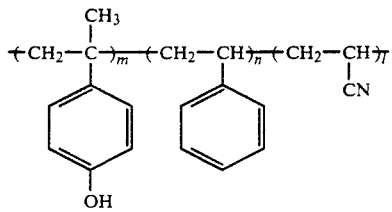

$\begin{pmatrix} Mw = 35000, Mw/Mn = 3.8 \\ m:n:l = 30:35:35 \end{pmatrix}$ (l)

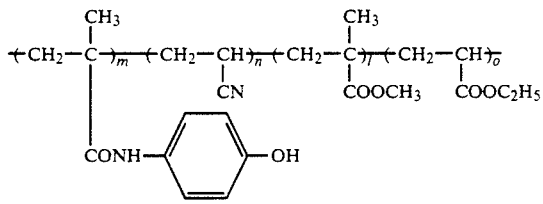

$\begin{pmatrix} Mw = 20000, Mw/Mn = 2.1 \\ m:n:l:o = 30:30:36.5:3.5 \end{pmatrix}$ The content of the above alkali-soluble resin in the photosensitive composition of the present invention is preferably 50–95 wt. %, more preferably 60–90 wt. %.

The halomethyloxadiazole compounds used in the present invention which release halogen free radicals upon irradiation of actinic rays are preferably those which are represented by the following formula:

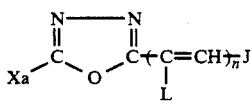

[VII]

wherein, Xa is a trihaloalkyl group, L is a hydrogen atom or a methyl group, J is a substituted or unsubstituted aryl group or heterocyclic group, and n stands for an integer of 0, 1 or 2.

Specific examples of the compounds represented by the formula [VII] are oxadiazole compounds having a benzofuran ring such as

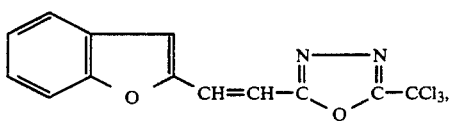

(1)

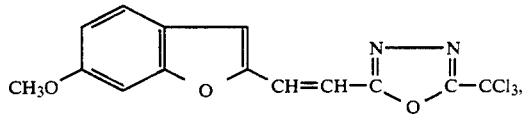

(2)

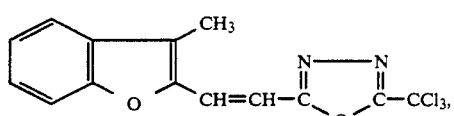

(3)

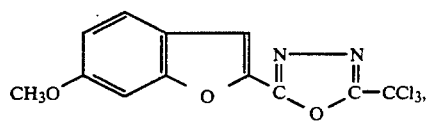

(4)

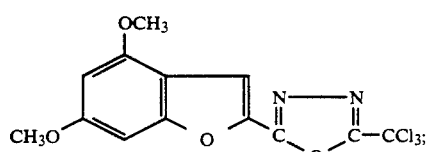

(5)

2-trichloromethyl-5-(p-methoxystyryl)-1,3,4-oxadiazole compounds disclosed in Japanese Laid-Open Patent Publication No. 54-74728; the following compounds disclosed in Japanese Laid-Open Patent Publication No. 60-241049:

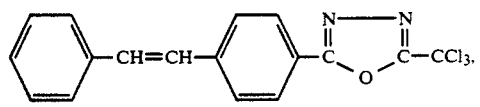

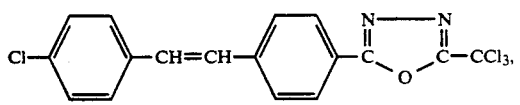

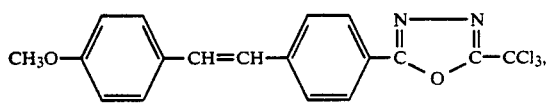

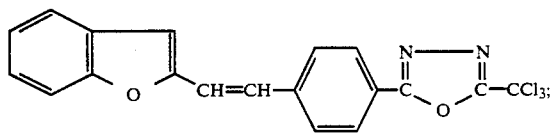

the following compounds disclosed in Japanese Laid-Open Patent Publication No. 54-74728 (1979):

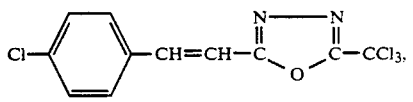

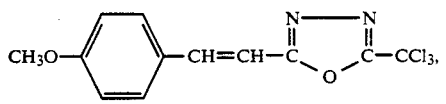

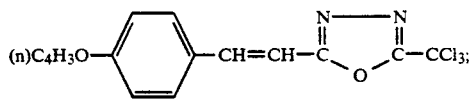

the following compounds disclosed in Japanese Laid-Open Patent Publication No. 55-7742 (1979):

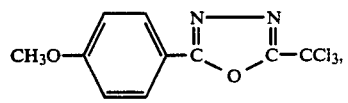

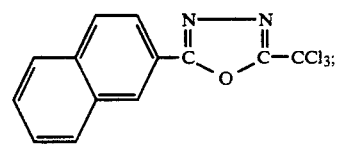

the following compounds disclosed in Japanese Laid-Open Patent Publication No. 60-3626 (1985):

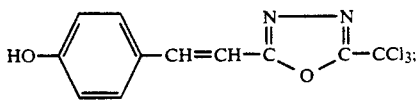

the following compounds disclosed in Japanese Laid-Open Patent Publication No. 60-177340 (1985):

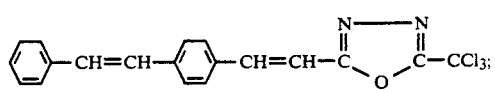

the following compounds disclosed in Japanese Laid-Open Patent Publication No. 61-143748 (1986):

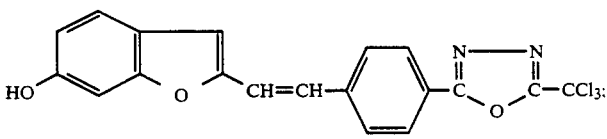

etc.

The content of the above-described halomethyloxazole compound, which produces halogen free radicals upon irradiation of said actinic light, in the photosensitive composition of the present invention is preferably 0.01-20 wt. %, more preferably 0.1-20 wt. % and most preferably 0.2-10 wt. %.

The dyes which interact with photodecomposition product of the above-described halomethyloxadiazole compounds include those which develop color and those which fade or discolor. Examples of the latter are dyes of diphenylmethane type, triphenylmethane type, thiazine type, oxazine type, xanthene type, anthraquinone type, iminonaphthoquinone type, azomethine type, etc.

Specific examples thereof are: brilliant green, eosine, ethyl violet, erythrosine B, methyl green, crystal violet, basic fuchsine, phenolphthalein, 1,3-diphenyltriazine, alizarine red S, thymolphthalein, methyl violet 2B, quinaldine red, rose bengal, methanyl yellow, thymol sulfophthalei, xylenol blue, methyl orange, orange IV, diphenyl dithiocarbazone, 2,7-dichlorofluoresceine, paramethyl red, congo red, benzopurpurine 4B, α-naphthyl red, nile blue 2B, nile blue A, phenacetarine, methyl violet, malachite green, parafuchsine, victoria pure blue BOH (manufactured by Hodogaya Chemical Industries, Ltd.), oil blue #603 (manufactured by Orient Chemical Industries, Ltd.), oil pink TM 312 (manufactured by Orient Chemical Industries, Ltd.), oil red 5B (manufactured by Orient Chemical Industries, Ltd.), oil scarlet #308 (manufactured by Orient Chemical Industries, Ltd.), oil red OG (manufactured by Orient Chemical Industries, Ltd.), oil red RR (Orient Chemical Industries, Ltd.), oil green #502 (Orient Chemical Industries, Ltd.), spiron red BEH special (Hodogaya Chemical Industries, Ltd.), m-cresol purple, cresol red, rhodamine B, rhodamine 6G, fast acid violet R, sulforhodamine B, auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenylamino-phenylimino-5- pyrazolone, 1-β-naphthyl-4-p-diethylaminophenylimino-5-pyrazolone etc.

Examples of the dyes which develop color are arylamines. Suitable arylamines include not only simple aryl amines such as primary or secondary amines but also leuco dyes.

Specific examples of such dyes are: diphenylamine, dibenzylaniline, triphenylamine, diethylaniline, diphenyl-p-phenylenediamine, p-toluidine, o-toluidine, 4,4'-biphenyldiamine, o-chloroaniline, o-bromoaniline, 4-chloro-o-phenylenediamine, o-bromo-N,N'-dimethylaniline, 1,2,3-triphenylguanidine, naphthylamine, diaminodiphenylmethane, aniline, 2,5-dichloroaniline, N-methyldiphenylamine, p,p'-tetramethyl-p-phenylenediamine, 1,2-dianilinoethylene, p,p',p''-hexamethyltriaminotriphenylmethane, p,p'-tetramethyldiaminotriphenylmethane, p,p'-tetramethyldiaminodiphenylmethylimine, p,p',p''-triamino-o-methyltriphenylmethane, p,p',p''-triaminophenylcarbinol, p,p'-tetramethylaminodiphenyl-4-anilinonaphthylmethane, p,p',p''-triaminotriphenylmethane, p,p',p''-hexapropyltriaminotriaminophenylmethane.

The content of the above-described dye in the photosensitive composition of the present invention is preferably 0.01-10 wt. %, more preferably 0.02-5 wt. %.

The photosensitive composition of the present invention may further contain an organic acid, acid anhydride, a surfactant, oleophilic agent, etc.

The organic acids which may be used in the present invention include known various organic acids, although those having a pKa value of not less than 2 is preferred. More preferred are those having a pKa value of 3.0-9.0 and most preferred are those having a pKa value of 3.5-8.0. The pH values indicated in the present specification are those at 25° C.

The organic acids usable in the present invention encompass all the organic acids listed on pages 1054-1058 in "Kisohen II of Kagakubinran (Handbooks of Chemistry, Book II of Fundamental Section)", published by Maruzen, 1966, which have a pKa value as described above.

Specific examples of such acids are: benzoic acid, adipic acid, azelaic acid, isophthalic acid, p-toluic acid, o-toluic acid, β-ethylglutaric acid, m-oxybenzoic acid, p-oxybenzoic acid, 3,5-dimethylbenzoic acid, 3,4-dimethoxybenzoic, glyceric acid, gluconic acid, glutaric acid, p-anisic acid, succinic acid, sebacic acid, β,β-diethylglutaric acid, 1,1-cyclobutanedicarboxylic acid, 1,3-cyclobutanedicarboxylic acid, 1,1-cyclopentanedicarboxylic acid, 1,2-cyclopentanedicarboxylic acid, 1,3-cyclopentanedicarboxylic β,β-dimethylglutaric acid, dimethylmalonic acid, α-tartaric acid, suberic acid, terephthalic acid, pimelic acid, phthalic acid, fumaric acid, β-propylglutaric acid, propylmalonic acid, mandelic acid, mesotartaric acid, β-methylglutaric acid, β,β-methylpropylglutaric acid, methylmalonic acid, malic acid, 1,1-cyclohexanecarboxylic acid, 1,2-cyclohexanedicarboxylic acid, 1,3-cyclohexanedicarboxylic acid, 1,4-cyclohexanedicarboxylic acid, cis-4-cyclohexane-1,2-dicarboxylic acid, erucic acid, erucic acid, undecenic acid, lauric acid, n-capric acid, pelalgonic acid, n-undecanoic acid, etc. Also organic acid having enolic structure such as Meldrum's acid, ascorbic acid, etc. can preferably be used. The organic acid content in the photosensitive layer is 0.05-10 wt. %, preferably 0.1-5 wt. %.

Acid anhydrides which may be used in the present invention include known various acids, but cyclic acid anhydrides are preferred.

Specific examples thereof are phthalic anhydride, tetrahydrophthalic anhydride, hexahydrophthalic anhydride, 3,6-endoxy-Δ$^4$-tetrahydrophthalic acid, tetrachlorophthalic anhydride, glutaric anhydride, maleic anhydride, chloromaleic anhydride, α-phenyl maleic acid anhydride, pyromellitic acid, etc. The content of these acid anhydrides in the photosensitive layer is 0.05-10 wt. %, preferably 0.1-5 wt. %.

In the present invention, various known surfactants can be used. However, those which have at least one of structural units represented by the following formulas [A] and [B] are preferred.

 [A]

 [B]

wherein n is an integer of 2-5,000.

The surfactants may contain either or both of structural units [A] and [B]. Those of which n is 2-5000 and the boiling point is not lower than 240° C. are preferred. Those of which n is 2-500 and the boiling point is not lower than 280° C. are more preferred and those of which n is 3-100 are most preferred.

Examples of such surfactants are: polyethyleneglycol HO—CH$_2$—CH$_2$—O—$_n$H, polyoxyethylenealkylether RO(CH$_2$CH$_2$O)$_n$H, polyoxyethylenealkylphenylether

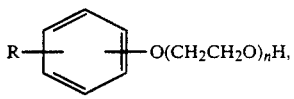

polyoxyethylenepolystyrylphenylether

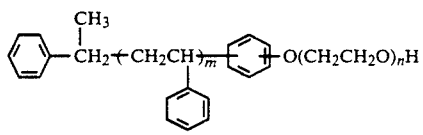

polyoxyethylene-polypropyleneglycol

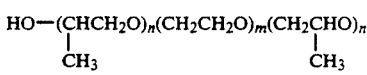

which includes block copolymer and random copolymer, polyoxyethylene-polyoxypropylenealkylether, which ends in alkylether structure and includes random copolymer

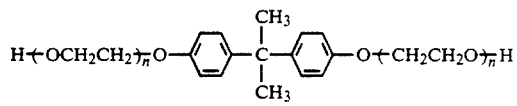

oxyethylene derivative of alkylphenol-formaldehyde condensate

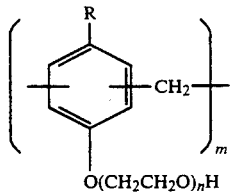

polyoxyethylene partial ester of polyhydric alcohol and aliphatic fatty acid such as:

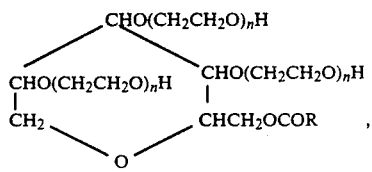

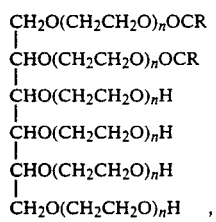

polyoxyethylene fatty acid ester such as $RCOO(CH_2CH_2O)_nH$, polyoxyethylenealkylamine

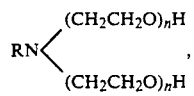

etc. In the above chemical formulas, n is as defined above and R is an alkyl group.

Specific examples of preferred surfactants are: polyoxyethylene-laurylether, polyoxyethylene-cetylether, polyoxyethylene-stearylether, polyoxyethyleneoleylether, polyoxyethylene-higher alcohol ether, polyoxyethylene-octylphenylether, polyoxyethylene-nonylphenylether, polyoxyethylene-nonylphenylether, polyoxyethylene-sorbitane monolaurate, polyoxyethylene-sorbitane monopalmitate, polyoxyethylene-sorbitane monostearate, polyoxyethylene-sorbitane tristearate, polyoxyethylene-sorbitane monooleate, tetraoleic acid-polyoxytheylene sorbitol, polyethyleneglycol monolaurate, polyethyleneglycol monolaurate, polyethyleneglycol monostearate, polyethyleneglycol monooleate, polyoxyethyleneglycol distearate, polyoxyethylenenonylphenylether-formaldehyde condensate, oxyethylene-oxypropylene block copolymer, polyethyleneglycol, tetraethyleneglycol, etc.

The content of the above-described surfactant having the structural unit [A] and/or [B] in the photosensitive composition is preferably 0.1-20 wt. %, and more preferably 0.2-10 wt. % on the basis of the total weight of the composition.

The above surfactants can be used alone or as a combination of two or more thereof within the above content range.

The photosensitive composition of the present invention may further contain oleophilic agent such as condensate of an alkyl-substituted phenol and formaldehyde.

The photosensitive composition of the present invention achieves the object of invention by incorporation of the compound of the present invention in combination with the above-described various components. In addition to the above components however, coloring agent such as dye and pigment, sensitizer, plasticizer, etc. may be added.

The photosensitive lithographic printing plate can be provided by dissolving the above components in a suitable solvent as listed below, applying the solution on a suitable support and drying it, thus forming a photosensitive layer.

As solvents for dissolving the components of the photosensitive composition, cellosolves such as methyl cellosolve, methyl cellosolve acetate, ethyl cellosolve, ethyl cellosolve acetate, etc.; dimethyl formamide, dimethyl sulfoxide, dioxane, acetone, cyclohexanone, trichloroethylene, methylethylketone, etc. can be used. They can, of course, be used alone or as a combination of two or more thereof.

The application of the photosensitive composition solution can be effected by any of known conventional methods such as whirler coating, wire bar coating, dip coating, air knife coating, roll coating, blade coating, curtain coating, etc. The coating amount is preferably 0.5-5.0 g/m$^2$, although it widely varies depending upon the use of the composition.

Supports on the surface of which the photosensitive layer containing the photosensitive composition of the present invention is to be formed are metal plates of aluminum, zinc, steel, copper, etc.; metal plates plated or vapor-deposition-coated with chromium, zinc, copper, nickel, aluminum, iron, etc.; paper; plastic film; glass plate; resin-coated paper; paper laminated with foil of a metal such as aluminum; hydrophilized plastic films; etc. Among them, aluminum plate is most preferred. For the practical use, aluminum plate, the surface of which is roughened or anodized and pore-sealed as desired, is preferably used.

These treatments can be carried out by way of any of conventional methods. Roughening can be effected by a mechanical method, electrolytic etching, etc. Mechanical method includes roughening by ball polisher, brushing, honing, buffing, etc. Considering composition of the used aluminum material, etc., a suitable method is employed alone or in combination with another method or methods. However, electrolytic etching is preferred.

Electrolytic etching is carried out using a bath comprising at least one of phosphoric acid, sulfuric acid, nitric acid, and other inorganic acids. After roughening, the plate is desmutted and the remaining acid is neutralized and rinsed away.

Anodizing is conducted with an aluminum plate as an anode in a bath comprising at least one of sulfuric acid, chromic acid, oxalic acid, phosphoric acid, malonic acid, etc. The amount (thickness) of the anodized film suitably is 1-50 mg/dm$^2$, preferably 10-40 mg/dm$^2$. The amount of the anodized film is measured by immersing in a phosphoric acid-chromic acid solution (a solution of 35 ml of 85% phosphoric acid and 20 g of chromium (VI) oxide in 1 liter of water) so as to remove oxide film and calculating the amount of the oxide from the weight difference between before and after the treatment.

Pore sealing can be effected by treatment with boiling water, steam, sodium silicate or an aqueous dichromate solution and other methods. Aluminum support plates can also be pre-treated with a water-soluble high polymer compound or an aqueous solution of a metal salt such as zirconium fluoride, etc.

The photosensitive lithographic printing plate using the photosensitive composition can be developed by the conventional method. For instance, the printing plate is exposed through a transparent positive film to the rays from a high pressure mercury lamp, a metal halide lamp, a xenon lamp, a tungsten lamp, etc. and developed with an alkali solution. As a result, only unexposed portion remains on the support surface and thus a positive-positive image is formed.

Various alkali developers such as solutions of sodium hydroxide, potassium hydroxide, sodium carbonate, potassium carbonate, sodium metasilicate, potassium metasilicate, sodium secondary phosphate, sodium tertiary phosphate, etc. can be used. The alkali metal salt concentration in the developer is preferably 0.1-10 wt. %. The developer can contain anionic or amphoteric surfactants and an organic solvent such as alcohol.

SPECIFIC DESCRIPTION OF THE INVENTION

Now the invention will be specifically described by way of working examples.

Examples 1-5 and Comparative Examples 1-4

Preparation of Aluminum Plate Support

An aluminum plate (1050, H16 temper) having a thickness of 0.24 mm was defatted in a 5 wt. % aqueous solution of sodium hydroxide at 60° C. for 1 minute. The defatted aluminum plate was electrolytically etched in a 0.5M aqueous solution of hydrochloric acid at 25° C. with electric current of a current density of 60 A/dm$^2$ for 30 sec. Thereafter, the treated aluminum plate was desmutted in a 5 wt. % solution of sodium hydroxide at 60° C. for 10 sec. Then the aluminum plate was anodized in a 20 wt. % sulfuric acid solution at 20° C. with electric current of a current density of 3 A/dm$^2$ for 1 minute. The anodized plate was subjected to pore sealing with hot water of 80° C. for 20 sec. and thus a support for a lithographic printing plate was obtained.

The thus prepared aluminum plate was coated with a photosensitive composition (coating solution) described below by a whirling coater and dried at 90° C. for 4 minutes. Thus a positive type photosensitive lithographic printing plate was obtained, which was designated Sample No. 1.

Photosensitive Composition

| | |
|---|---|
| Novolak resin (1) (alkali-soluble resin) | 7.0 g |
| Compound of the present invention (QD-1) | 1.4 g |
| Halomethyloxadiazole compound (rad-1) | 0.05 g |
| Victoria pure blue BOH | 0.07 g |
| Methyl cellosolve | 100 ml |

In the same manner, but using different compounds of the present invention or other photosensitive compounds and different halomethyloxadiazole compounds indicated in Table 1, with varied contents thereof, Samples No. 2–5 and Comparative Samples 1–4 were prepared.

Each of the thus prepared samples was exposed to the light from a 2 KW metal halide lamp ("Eyediolthin 2000" manufactured by Iwasaki Electric Co.) at a distance of 90 cm, through a sensitivity-measuring tablet (Eastman Kodak No. 2, 21 step gray scale with density difference of 0.15) tightly attached to the plate for varied periods of time. The exposed samples were developed with a developer, which is SDR-1 (supplied by Konica Corporation) diluted by a factor of 6, for 20 sec. Sensitivity was indicated by the time in which the photosensitive layer at Step 5.0 was completely removed.

In order to check the underdevelopability, further diluted developers, that is, deteriorated developers were used. Namely, the SDR-1 developer was diluted to 9-fold, 10-fold and 11-fold and printing plates, which were developed with these diluted developers at 27° C. for 20 sec., were used for test printing with Mark Five Scarlet ink (manufactured by Toyo Ink Co.) using "Heidel GTO". Printing performance was evaluated visually observing staining at positions of the mesh openings in the shadow portions.

In order to check visible-on-exposure characteristic, density difference between the exposed portion and the unexposed portion of printing plates exposed under the same conditions as described above was visually observed and also measured by a densitometer (Sakura Densitometer PDA-65). The greater the density difference, the better the visible-on-exposure characteristic.

The results are summarized in Table 1 and 2.

TABLE 1

| Printing Plate Sample No. | Alkali-Soluble Resin *1 | | Photosensitive Material *2 | | Photodecomposing Visibilizing Agent | |
|---|---|---|---|---|---|---|
| | Resin | Amount (g) | Comp. | Amount (g) | Comp. | (g) |
| 1 (Invention) | Novolak Resin (1) | 7.0 | QD-1 | 1.4 | rad-1 | 0.05 |
| 2 (Invention) | Novolak Resin (1) | 5.8 | QD-2 | 2.6 | rad-2 | 0.07 |
| 3 (Invention) | Novolak Resin (1) | 6.4 | QD-3 | 2.0 | rad-3 | 0.06 |
| 4 (Invention) | Novolak Resin (1) | 6.2 | QD-4 | 2.2 | rad-1 | 0.05 |
| 5 (Invention) | Novolak Resin (1) | 6.8 | QD-5 | 1.6 | rad-2 | 0.07 |
| 1 (Comparative) | Novolak Resin (1) | 7.0 | Q'D-1 | 1.4 | rad-1 | 0.05 |
| 2 (Comparative) | Novolak Resin (1) | 6.8 | Q'D-2 | 1.6 | rad-2 | 0.07 |
| 3 (Comparative) | Novolak Resin (1) | 7.0 | QD-1 | 1.4 | s-triazine | 0.025 |
| 4 (Comparative) | Novolak Resin (1) | 7.0 | QD-1 | 1.4 | diphenyl iodonium bromide | 0.05 |

*1, *2: Refer to description below

TABLE 2

| Printing Plate Sample No. | Sens'ty (sec) | Underdevelopability | | | Visible-on-Exposure Characteristic | |
|---|---|---|---|---|---|---|
| | | Dil. × 9 | Dil. × 10 | Dil. × 11 | Vis. Obs. | ΔD |
| 1 (Invention) | 50 | ◯ | ◯ | ◯ | ◯ | 0.15 |
| 2 (Invention) | 55 | ◯ | ◯ | ◯ | ◯ | 0.13 |

TABLE 2-continued

| Printing Plate Sample No. | Sens'ty (sec) | Underdevelopability Dil. × 9 | Dil. × 10 | Dil. × 11 | Visible-on-Exposure Characteristic Vis. Obs. | ΔD |
|---|---|---|---|---|---|---|
| 3 (Invention) | 60 | ○ | ○ | ○ | ○ | 0.15 |
| 4 (Invention) | 50 | ○ | ○ | ○ | ○ | 0.14 |
| 5 (Invention) | 70 | ○ | ○ | △ | ○ | 0.13 |
| 1 (Comparative) | 70 | △ | X | X | △ | 0.08 |
| 2 (Comparative) | 70 | ○ | △ | X | △ | 0.09 |
| 3 (Comparative) | 60 | ○ | △ | X | X | 0.04 |
| 4 (Comparative) | 60 | ○ | △ | X | X | 0.02 |

Underdevelopability
○: No staining at positions of mesh openings in the shadow portions
△: Slight staining at positions of mesh openings in the shadow portions
X: Staining at positions of mesh openings in the shadow portions
Visible-on-exposure characteristic
○: Good
△: Slightly poor
X: Poor As apparent from Table 2, Samples No. 1–5, which were prepared using the photosensitive compositions of the present invention, are superior to Comparative Samples No. 1 and 2, which were prepared without using 1,2-naphthoquinone-2-diazido-4-sulfonic acid esters, in all the sensitivity, underdevelopability and visible-on-exposure characteristic.

Comparative Samples No. 3 and 4, which were prepared without halomethyloxadiazole compounds, are inferior not only in the visible-on-exposure characteristic but also in the underdevelopability.

The substances referred to in Table 1 are now explained.

1: Novolak resins (1)

Copolymer of phenol, m-cresol, p-cresol and formaldehyde (the molar ratio m-cresol:p-cresol:p-cresol=2.0:4.8:3.2, Mw=6,000, Mw/Mn=5.0)

2: Compounds of the present invention (1,2-naphthoquinone-2-diazido-4-sulfonic acid esters) and similar compounds.

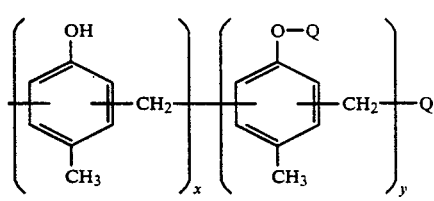

QD-1

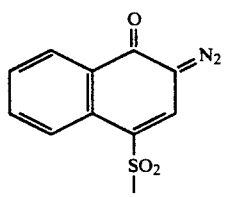

wherein x:y=1:1, and Q is 1,2-naphthoquinone-2-diazido-4-sulfonyl. The Mw of the resin before Q was bonded was 900.

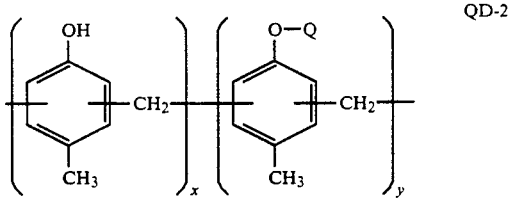

QD-2 wherein x:y=3:1, and Q is as defined above. The Mw of the resin before Q was bonded was 900.

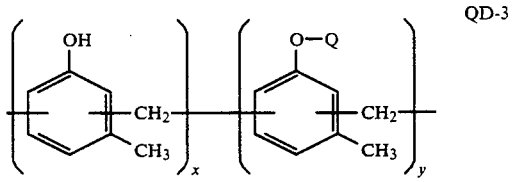

QD-3 wherein x:y=2:1, and Q is as defined above. The Mw of the resin before Q was reacted was 1,300.

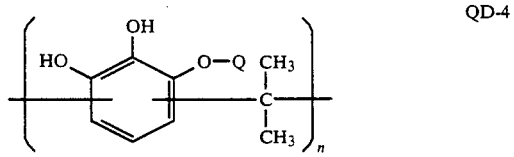

QD-4 wherein n is an integer of 10–200 and Q is as defined above. The Mw of the resin before Q was reacted with Q was 1,500.

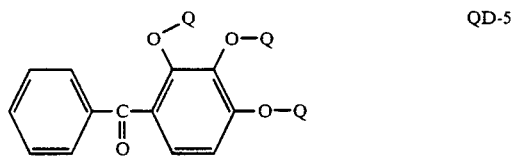

QD-5 wherein Q is as defined above.

Q'D-1 The same as QD-1 except that Q' as indicated below is bonded instead of Q.

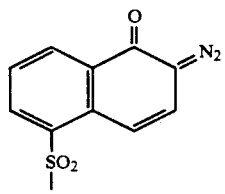

Q'D-2 The same as QD-5 except that Q' as defined above is bonded instead of Q.

3 Halomethyloxadiazole compound:

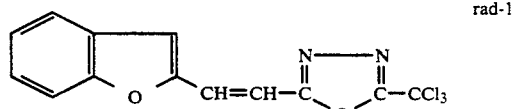

rad-1

-continued

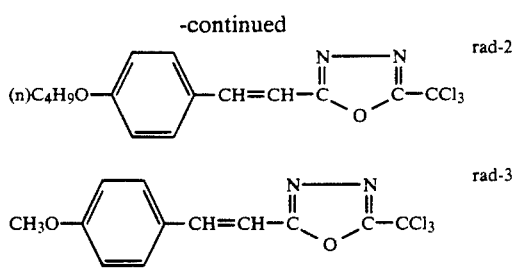

Further, the preparations of photosensitive material and binder are illustrated below.

Preparation of Binders

Synthesis 1

Synthesis of a binder of the formula a) below 400 g of p-hydroxyaniline, 4 g of hydroquinonemonomethylether, 4 l of acetone and 360 g of pyridine were mixed. The mixture was chilled with a freezing mixture from outside. When the internal temperature reached $-10°$ C., 420 g of methacrylic acid was added dropwise. The reaction temperature was kept under 0° C. by regulating the rate of addition. After the addition was finished, the reaction mixture was stirred for about 2 hours at 0-3° C. and further stirred for 2 hours at 25° C. The reaction mixture was concentrated to about $\frac{1}{3}$ in volume and then poured into 10 liters of diluted hydrochloric acid (pH: about 1.0). The produced precipitate was collected by suction filtration and a white solid product was obtained. The white product was dissolved in 2 liters of warmed methanol and 2 liters of a 5% aqueous solution of sodium carbonate was added to the solution and the resulting solution was stirred at 40° C. for 30 minutes. The solution, which was dark red, was poured into 8 liters of a 5% aqueous solution of hydrochloride acid and a large amount of precipitate was produced. The precipitate was collected by suction filtration and dried and thus a pale pink solid product was obtained. The product was recrystallized from a mixture of ethanol and water and 450 g of colorless needles of p-hydroxymethacrylanide were obtained, which exhibited a melting point of 155°-156° C.

53.2 g of the thus obtained p-hydroxymethacrylanilide (HyPMA), 15.9 g of acrylonitrile (AN), 40.0 g of methyl methacrylate (MMA) and 3 g of α,α'-azobisisobutyronitrile were dissolved in 250 ml of ethanol. After the head space was replaced with nitrogen gas, the reaction mixture was kept at 75° C. for 4 hours and a polymer solution was obtained. The polymer solution was poured into 3 liters of a 5% aqueous solution of hydrochloric acid, the produced white precipitate was collected by filtration and dried and thus 70 g of white polymer was obtained. The molecular weight thereof was measured by GPC and it was proved that the Mn was 8,600 and the Mw was 18,000.

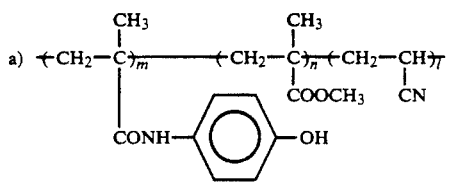

wherein m:n:l=30:40:30.

Comparative Synthesis 1

Synthesis of a Comparative Binder

The procedure of Synthesis 1 was repeated using 2-hydroxyethyl methacrylate instead of p-hydroxyethacrylanilide. The Mn and Mw of the obtained polymer measured by GPC were 2,300 and 15,000 respectively.

Preparation of Photosensitive Materials

Synthesis 2

20 g of 2,3,4-trihydroxybenzophenone was dissolved in 720 ml of dioxane and 70 g of 1,2-naphthoquinonediazido-4-sulfonyl chloride was added to the solution. After it was dissolved, 60 g of a 18% aqueous solution of sodium hydroxide was added and allowed to react. The resulting reaction mixture was poured into a large amount of diluted hydrochloric acid (13 ml of conc. hydrochloric acid and 3 liters of water) and the precipitate was collected by filtration and dried. Thus 80 g of yellow powder of 1,2-naphthoquinonediazido-4-sulfonic acid ester of 2,3,4-trihydroxybenzophenone was obtained. The analysis revealed that the condensation rate of OH groups was 95%.

Comparative Synthesis 2

Synthesis of a Comparative Photosensitive Material

In a three-necked flask placed in a water bath, 100 g of pyrogallol and 700 liters of acetone were placed. After nitrogen gas was blown in for replacement, 10 g of phosphorus oxychloride was added and polycondensation was effected. The reaction was continued for about 24 hours, the reaction temperature being kept at 20° C. After the reaction was finished, the reaction mixture was slowly poured into 30 liters of water while vigorously agitated and thus the polycondensate was precipitated.

The produced precipitate was collected by filtration, washed with water until it became neutral, and dried at not higher than 40° C. Thus 100 g of light brown resin was obtained.

The molecular weight of this resin was measured by GPC (Hitachi Type 635; column: Shodex A804, A803 and A802 in series). Mn and Mw were calculated in accordance with the Tsuge et al's method described on page 100 of Journal of Chem. Soc. of Japan. They were 2,000 and 3,400 respectively with polystyrene as reference.

60 g of this resin was dissolved in 720 ml of dioxane and 70 g of 1,2-naphthoquinonediazido-5-sulfonyl chloride was added to the solution. After it was dissolved, 60 g of a 13% aqueous solution of potassium carbonate was added and allowed to react. The resulting reaction mixture was poured into a large amount of diluted hydrochloric acid (13 ml of conc. hydrochloric acid and 3 liters of water) and the precipitate resin was collected by filtration and dried. Thus 56 g of yellow resin powder of 1,2-naphthoquinonediazido-5-sulfonic acid ester of pyrogallolacetone resin was obtained. The analysis revealed that the condensation rate of OH groups was 20%. The molecular weight was measured by the above-described method and it was revealed that Mn was 2,300 and Mw was 3,030.

EXAMPLE 6

A 0.24 mm-thick aluminum plate was defatted with a 5% sodium hydroxide aqueous solution and subjected to electrolytic etching in a 3M nitric acid aqueous solution at 30° C. with electric current of a current density of 50 A/dm$^2$. The thus treated plate was desmutted with a 5% sodium hydroxide aqueous solution and anodized in a sulfuric acid solution. The amount of the anodized film was measured by the above-described method and it was proved to be 20 mg/dm$^2$ The resulting plate was pore-sealed with hot water of 90° C.

The thus obtained aluminum plate (support) was coated with the photosensitive coating solution described below by a whirler coater. The coated plate was dried at 100° C. for 4 minutes and a photosensitive lithographic printing plate with a 24 mg/dm$^2$ photosensitive layer was obtained.

Photosensitive Solution 1

| | |
|---|---|
| An ester of 2,3,4-trihydroxybenzophenone and 1,2-naphthoquinonediazido-4-sulfonic acid chloride (condensation rate: 95%) (product of Synthesis 2) | 20 parts |
| Binder of Synthesis 1 | 80 parts |
| 2-Trichloromethyl-5-[β-(2'-benzofuryl)vinyl]-1,3,4-oxadiazole | 2 parts |
| Victoria blue BOH | 1 part |
| An ester of p-t-octylphenol-formaldehyde novolak resin (Mw = 1,3000) and 1,2-naphthoquinonediazido-5-sulfonic acid chloride (condensation rate: 50 mole %) | 1 part |
| Benzoic acid | 5 part |
| Methyl cellosolve | 200 parts |
| Ethyl cellosolve | 500 parts |

The obtained photosensitive lithographic printing plate was exposed to the light of a 3 KW high pressure mercury lamp at the distance of 60 cm through a transparent film for 30 sec. and developed with a 9 times diluted positive type developer "SDD-1"(supplied by Konica Corporation) at 25° C. for 45 sec. The sensitivity, visible-on-exposure characteristic, development latitude and light tolerance were measured.

Comparative Example 5

Using an ester of 2,3,4-trihydroxybenzophenone and 1,2-naphthoquinonediazido-5-sulfonic acid chloride (condensation rate: 25 mole %) instead of photosensitive material of Example 5, a photosensitive coating solution (Comparative Photosensitive Solution 1) was prepared in the same manner as in Example 6, a printing plate was prepared in the same manner as in Example 6 and the same measurements were carried out.

Comparative Example 6

Using the photosensitive material of Comparative Synthesis 2 (ester of pyrogallol-acetone resin and 1,2-naphthoquinonediazido-5-sulfonic acid), a photosensitive coating solution (Comparative Photosensitive Solution 2) was prepared in the same manner as in Example 1, a printing plate was prepared in the same manner as in Example 1 and the same measurements were carried out.

The results of Example 6, Comparative Examples 5 and 6 are summarized in Table 3.

TABLE 3

| | Example 6 | Comparative Ex. 5 | Comparative Ex. 6 |
|---|---|---|---|
| Photosensitive Composition | Photosensitive Solution 1 Ester of 2,3,4-trihydroxybenzophenone and 4-sulfonic acid chloride | Comp. Photosensitive Solution 1 Ester of 2,3,4-trihydroxybenzophenone and 5-sulfonic acid chloride | Comp. Photosensitive Solution 2 Ester of pyrogallol-acetone resin and 5-sulfonic acid chloride |
| Sensitivity | 3.2 Steps | 3.2 Steps | 3.0 Steps |
| Chemical Resistance (*1) | | | |
| 50% Isopropyl alcohol | 10 | 10 | 9 |
| Ultra Plate Cleaner (3) | 10 | 9 | 5 |
| Polymetic Plate Cleaner (4) | 10 | 10 | 10 |
| FD Float Cleaner (5) | 9 | 9 | 8 |
| UV Roller Cleaner (6) | 8 | 7 | 6 |
| Developer SPO-1 (7) | 10 | 10 | 8 |
| Development Latitude (*2) | | | |
| Overdevelopability | | | |
| × 4 | +2 Steps | +5 Steps | Image disappeared |
| × 5 | +1 Steps | +3 Steps | " |
| Underdevelopability × 10 | ○ | ○ | ○ |
| (25° C., 45") × 12 | ○ | ○ | Δ |
| Visibility on exposure (400 mJ/cm$^2$, visual observation) | ○ | Δ | Δ |
| Light tolerance (*3) (white fluorescent lamp 300 lx., min.) | not less than 30 min. | 15 minutes | 10 minutes |

Notes to Table 3

1 Chemical Resistance

Chemical resistance was measured by visual observation of degree of damage of lines of image of printing plates which had been soaked in each chemical for 1 day. Evaluation was made by 10 rankings. (10: very good, 5: considerable damage of image lines, disappearing of dots and 0: disappearing of image portion)

(3) Manufactured by ABC Chemicals Ltd.
(4) Manufactured by Eastman Kodak Co.
(5) For UV ink, manufactured by Toyo Ink Co.
(6) For UV ink, manufactured by Toka Pigment Co.

2 Development Latitude

Development was carried out using diluted SDP-1 developer for 45 sec. at 25° C.

In underdevelopability:

○: The photosensitive layer at the non-image portion is completely dissolved and disappears.

Δ: The photosensitive layer at the non-image portion partly remains.

x: The photosensitive layer at the non-image portion remains almost completely.

In overdevelopability:

The number means step difference from the sample developed by a standard developer, which is a 8 diluted SDP-1.

3 Light Tolerance

In order to check light tolerance, positive type lithographic printing plates were exposed to the light of a white fluorescence lamp (300 lx. PS PLATE) FOR 5, 10, 15, 20, 25 and 30 minutes. The exposed plates were developed with 6 times diluted SDP-1 developer and the reduction in thickness of the photosensitive layer was measured. The exposure time which causes 10% reduction in the photosensitive layer is given as light safety time.

Tests of Printing Performance, Developability and Durability of Printing Plates

Printing performance, developability and durability were tested.

Printing performances was tested as follows. Printing plates were mounted on an offset printing machine and wood free paper was printed. Printing performance was evaluated by observing the staining of the non-image portion. The printing plate of Example 6 produced completely no stain in the non-image portion and exhibited excellent printing performance.

Developability was tested as follows. Photosensitive printing plates were forced to be deteriorated by placing them in an environment of 40° C. and 80% RH for 7 days. The thus treated printing plates were exposed, developed with a 7 times diluted SDP-1 developer and subjected to printing. Good printings without stains on the non-image portion were obtained. It was proved that the printing plate of Example 6 exhibited excellent developability.

Durability was tested as follows. UV printing was carried out under the following conditions.

Machine: Hamadastar CDX-900

Ink: Toyo Flash-Dry OL Scarlet Ap (manufactured by Toyo Ink Co.)

Reducer: Toyo Flash-Dry Reducer OP (manufactured by Toyo Ink Co.)

Paper: Wood free paper

Printing Speed: 7000 sheets/hr.

Even after 25 thousand sheets were printed, no stain appeared in the non-image portion and good printings were produced.

Comparative Example 7

Using the binder of Comparative Synthesis 1 instead of the binder of Synthesis 1 (that is, 2-hydroxyethyl methacrylate was copolymerized instead of p-hydroxymethacrylanilide (HyPMA)), a photosensitive lithographic printing plate was prepared in the same manner as in Example 6. The obtained printing plate was exposed and subjected to developing in the same manner as in Example 6. But the printing plate was not developed. This fact proved that presence of phenolic hydroxyl groups was essential.

EXAMPLE 7

Using an ester of Bisphenol A and 1,2-benzoquinonediazido-4-sulfonic acid chloride (condensation rate: 90 mol %) instead of the photosensitive material of Example 6, a photosensitive printing plate was prepared in the same manner as in Example 6.

With this printing plate, UV printing was carried out in the same manner as described above. Even after 10 thousand sheets were printed, printings were stain-free.

As has been described above, the photosensitive composition of the present invention exhibits excellent visible-on-exposure characteristic, development latitude, light tolerance, durability, etc.

We claim:

1. A photosensitive composition comprising a mixture of:
   (a) 5–60 wt. % of a 1,2-naphthoquinone-2-diazido-4-sulfonic acid ester compound;
   (b) 50–95 wt. % of an alkali-soluble resin;
   (c) 0.01–20 wt. % of a halomethyloxadiazole compound which releases halogen free radicals upon irradiation with actinic rays; and
   (d) 0.01–10 wt. % of a dye which interacts with the decomposition product of said halomethyloxadiazole compound and discolors or develops color.

2. The photosensitive composition as recited in claim 1, wherein said alkali-soluble resin (b) contains a polymer having a structural unit represented by the formula:

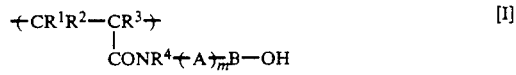

wherein $R^1$ and $R^2$ are respectively a hydrogen atom, a halogen atom, an alkyl group, an aryl group or a carboxylic group; $R^3$ is a hydrogen atom, a halogen atom, an alkyl group or an aryl group; $R^4$ is a hydrogen atom, an alkyl group or an aryl group or an aralkyl group; B is a divalent aromatic group which may have a substituent or substituents; A is a divalent organic group; and m is an integer of 0–5.

3. The photosensitive composition as recited in claim 1, wherein said alkali soluble resin (b) is a novolak resin or a vinyl polymer which contains structural units having phenolic hydroxyl groups.

4. The photosensitive composition as recited in any of claim 1–3, wherein the 1,2-naphthoquinone-2-diazido-5-sulfonic acid ester compound (a) is a polycondensate of 1,2-naphthoquinone-2-diazido-4-sulfonic acid, a phenol and an aldehyde or a ketone.

5. The photosensitive composition as recited in claim 3 wherein the vinyl polymer as an alkali-soluble resin (b) is a polymer containing (meth)acrylic acid, an ester of an aliphatic monocarboxylic acid or a nitrile.

6. The photosensitive composition as recited in claim 1, wherein the alkali-soluble resin (b) is a phenol-m-cresol·p-cresol·formaldehyde resin.

7. The photosensitive composition as recited in claim 1 wherein 1,2-naphthoquinone-2-diazido-4-sulfonic acid ester compound is an ester of 1,2-naphthoquinone-2-diazido-4-sulfonic acid and 2,3,4-trihydroxybenzophenone.

8. The photosensitive composition as recited in claim 1, wherein the alkali-soluble resin (b) contains structural units represented by the formula

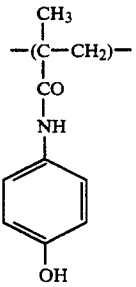

* * * * *